(12) United States Patent
Kang et al.

(10) Patent No.: US 9,354,522 B2
(45) Date of Patent: May 31, 2016

(54) BLOCK COPOLYMER AND PATTERN FORMING METHOD USING THE SAME

(71) Applicants: SAMSUNG DISPLAY CO., LTD., Yongin, Gyeonggi-Do (KR); SOGANG UNIVERSITY RESEARCH FOUNDATION, Seoul (KR)

(72) Inventors: Min Hyuck Kang, Seoul (KR); Tae Woo Kim, Seoul (KR); Myung Im Kim, Suwon-Si (KR); Moon Gyu Lee, Suwon-Si (KR); Su Mi Lee, Hwaseong-Si (KR); Seung-Won Park, Seoul (KR); Lei Xie, Suwon-Si (KR); Bong-Jin Moon, Seoul (KR); Na Na Kang, Seoul (KR)

(73) Assignee: SAMSUNG DISPLAY CO., LTD., Yongin-Si, Gyeonggi-Do (KR)

( * ) Notice: Subject to any disclaimer, the term of this patent is extended or adjusted under 35 U.S.C. 154(b) by 0 days.

(21) Appl. No.: 14/466,735

(22) Filed: Aug. 22, 2014

(65) Prior Publication Data
US 2015/0218300 A1  Aug. 6, 2015

(30) Foreign Application Priority Data

Feb. 3, 2014  (KR) .......................... 10-2014-0012192

(51) Int. Cl.
*G03C 1/00* (2006.01)
*G03F 7/40* (2006.01)
*H01L 21/308* (2006.01)
*C08F 293/00* (2006.01)

(52) U.S. Cl.
CPC ................ *G03F 7/40* (2013.01); *C08F 293/00* (2013.01); *H01L 21/3081* (2013.01)

(58) Field of Classification Search
CPC ........ C08F 299/04; C08F 7/26; C08F 299/00; C08F 299/0478; C03F 7/40; H01L 21/3081; H01L 21/312; H01L 21/308
USPC ................. 430/270.1, 270.11, 270.12, 280.1, 430/286.1; 438/717, 725, 736
See application file for complete search history.

(56) References Cited

U.S. PATENT DOCUMENTS

| | | | |
|---|---|---|---|
| 6,709,806 B2 * | 3/2004 | Hotta et al. ................... | 430/322 |
| 7,148,555 B2 | 12/2006 | Yates et al. | |
| 7,964,107 B2 | 6/2011 | Millward | |
| 8,168,213 B2 * | 5/2012 | Kangas et al. ................ | 424/423 |
| 8,268,180 B2 | 9/2012 | Arnold et al. | |

(Continued)

FOREIGN PATENT DOCUMENTS

| | | |
|---|---|---|
| JP | 4421582 | 12/2009 |
| KR | 10-0983356 | 9/2010 |

(Continued)

OTHER PUBLICATIONS

Se Jin Ku, et al., "Nanopporous Hard Etch Masks Using Silicon-Containing Block Copolymer Thin Film," Polymer 52 (2011) pp. 86-90.

(Continued)

*Primary Examiner* — Lan Vinh
(74) *Attorney, Agent, or Firm* — F. Chau & Associates, LLC

(57) ABSTRACT

A block copolymer includes: a first block, and a second block copolymerized with the first block. The second block includes a silyl group including a ring-type functional group.

18 Claims, 9 Drawing Sheets

(56) References Cited

U.S. PATENT DOCUMENTS

| | | | |
|---|---|---|---|
| 8,425,982 B2 | 4/2013 | Regner | |
| 2006/0172149 A1* | 8/2006 | Ahn et al. | 428/690 |
| 2009/0035668 A1* | 2/2009 | Breyta et al. | 430/18 |
| 2012/0046415 A1* | 2/2012 | Millward et al. | 525/105 |
| 2013/0022785 A1 | 1/2013 | Ellison et al. | |
| 2013/0133825 A1* | 5/2013 | Hattori et al. | 156/272.2 |
| 2013/0196019 A1 | 8/2013 | Willson et al. | |

FOREIGN PATENT DOCUMENTS

| | | |
|---|---|---|
| KR | 10-2011-0108034 | 10/2011 |
| KR | 10-2012-0095782 | 8/2012 |
| KR | 10-2013-0039555 | 4/2013 |
| KR | 10-2013-0050874 | 5/2013 |

OTHER PUBLICATIONS

Mikihito Takenaka, et al., "Formation of Long-Range Stripe Patterns with Sub-10-nm Half-Pitch from Directed Self-Assembly of Block Copolymer," Journal of Polymer Science: Part B: Polymer Physics, vol. 48, pp. 2297-2301, (2010).

Yu-Chih Tseng, et al., "Enhanced Block Copolymer Lithography Using Sequential Infiltration Synthesis," The Journal of Physical Chemistry C, pp. 17725-17729 (2011).

Julia D. Cushen, et al., "Oligosaccharide/Silicon-Containing Block Copolymers With 5 nm Features for Lithographic Applications" ACS Nano, vol. 6., No. 4, pp. 3424-3433 (2012).

* cited by examiner

BLOCK COPOLYMER AND PATTERN FORMING METHOD USING THE SAME

CROSS-REFERENCE TO RELATED APPLICATION

This application claims priority to Korean Patent Application No. 10-2014-0012192 filed on Feb. 3, 2014, the disclosure of which is hereby incorporated by reference herein in its entirety.

(a) TECHNICAL FIELD

The present disclosure relates to a block copolymer and a pattern forming method using the same.

(b) DISCUSSION OF THE RELATED ART

A pattern formation method using a block copolymer may form a pattern having a minute line width with a relatively simple process and a low cost such that research on the pattern formation method using the block copolymer has been actually developed. Further, the pattern formation method using the block copolymer may control the molecular weight of the block copolymer for patterns of various sizes, and control the molecular weight ratio of the block copolymer to form patterns of various shapes.

The block copolymer is a kind of polymer material, and has a form where ends of two or more polymers are connected to each other through a covalent bond. In a diblock copolymer that is the simplest structure of the block copolymer, two polymers having different properties are connected to each other to form one polymer. The two polymers that are connected to each other may be relatively easily phase-separated due to different material properties, and the block copolymer may be finally self-assembled to form a nanostructure.

For example, a method for forming a pattern by use of a block copolymer includes selectively removing one of two blocks, and transferring a pattern to a lower part by using the remaining structure. In this instance, when the remaining structure lacks mask performance, it may become difficult to transfer the pattern to a lower structure body that needs transferring of a pattern.

SUMMARY

Exemplary embodiments of the present invention provide a block copolymer for increasing pattern transfer performance, and a pattern forming method using the same.

An exemplary embodiment of the present invention provides a block copolymer including: a first block, and a second block copolymerized with the first block, and in which the second block includes a silyl group including a ring-type functional group.

The ring-type functional group is a triphenyl silyl group expressed in Formula 1.

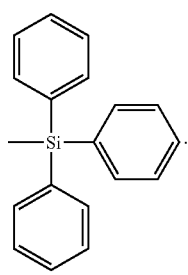

Formula 1

The second block includes at least one selected from the group including polystyrene, polymethyl methacrylate, polyvinyl pyrrolidone, polyisoprene, and polystyrene, and the ring-type functional group is connected to at least one selected from the group including the polystyrene, the polymethyl methacrylate, the polyvinyl pyrrolidone, the polyisoprene, and the polystyrene.

The first block and the second block are compounds expressed in Formula 2.

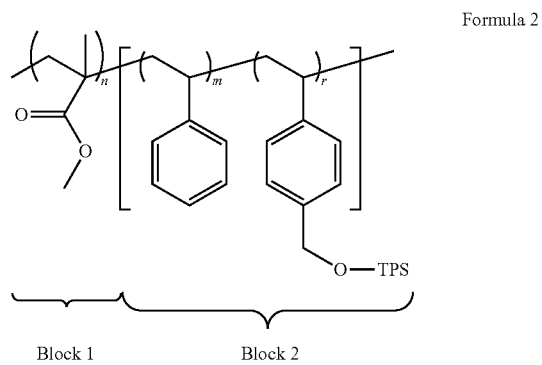

Formula 2

Herein, TPS is a triphenyl silyl group, n and m are 0-99, and r is 1-99.

The first block includes one selected from a group including polymethyl methacrylate, polyethylene oxide, polyvinyl pyrrolidone, and polyisoprene.

An exemplary embodiment of the present invention provides a method for forming a pattern including: coating a block copolymer including: a first block; and a second block copolymerized with the first block, and in which the second block includes a silyl group including a ring-type functional group to a substrate on which a mother pattern layer is formed, and forming a polymer thin film, selectively removing the first block from the polymer thin film, and etching the mother pattern layer using the second block as a mask.

The method further includes thermally annealing or solvent-annealing the polymer thin film.

The method further includes forming a guide pattern before forming the polymer thin film, wherein the polymer thin film is formed between the guide patterns.

The guide pattern is formed with a photoresist.

The selectively removing of the first block includes performing dry etching with a gas including oxygen ($O_2$).

In the selectively removing of the first block, the second block is transformed into a compound including a silicon oxide (SiOx).

The ring-type functional group is a triphenyl silyl group expressed in Formula 1.

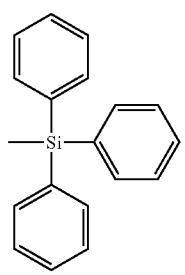

Formula 1

The second block includes at least one selected from the group including polymethyl methacrylate, polyvinyl pyrrolidone, polyisoprene, and polystyrene, and the ring-type functional group is connected to at least one selected from the group including the polymethyl methacrylate, the polyvinyl pyrrolidone, the polyisoprene, and the polystyrene.

The first block and the second block are compounds expressed in Formula 2.

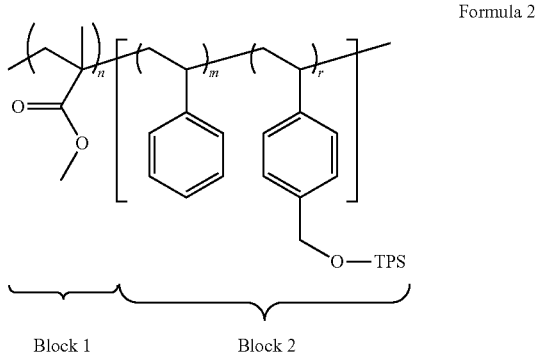

Formula 2

Block 1    Block 2

Herein, TPS is a triphenyl silyl group, n and m are 0-99, and r is 1-99.

The first block includes one selected from a group including polymethyl methacrylate, polyethylene oxide, polyvinyl pyrrolidone, and polyisoprene.

The etching of a mother pattern layer includes performing dry etching with a gas including at least one of tetrafluoromethane ($CF_4$), sulfur hexafluoride ($SF_6$), and chlorine ($Cl_2$).

The method further includes forming a neutralization layer on the mother pattern layer.

The method further includes annealing the substrate including the polymer thin film to thereby phase-separate the polymer thin film into the first block and the second block.

The neutralization layer may be formed with a self-assembled monolayer (SAM), a polymer brush, and a cross-linked random copolymer mat (MAT).

A distance between guide patterns may be less than about 2 um.

According to exemplary embodiments of the present invention, the silyl group in which one block of the block copolymer includes a ring-type functional group is included. In the process for dry-etching one block of the block copolymer with a gas including oxygen and removing the same, the silyl group including a ring-type functional group is transformed with a silicon oxide having etching resistance. Therefore, the remaining block includes a silicon oxide, and the block including the silicon oxide is pattern-transferred with a mask thereby realizing excellent pattern transferring.

BRIEF DESCRIPTION OF THE DRAWINGS

Exemplary embodiments of the present invention can be understood in more detail from the following detailed description taken in conjunction with the attached drawings in which.

DETAILED DESCRIPTION OF EXEMPLARY EMBODIMENTS

Figure 1:
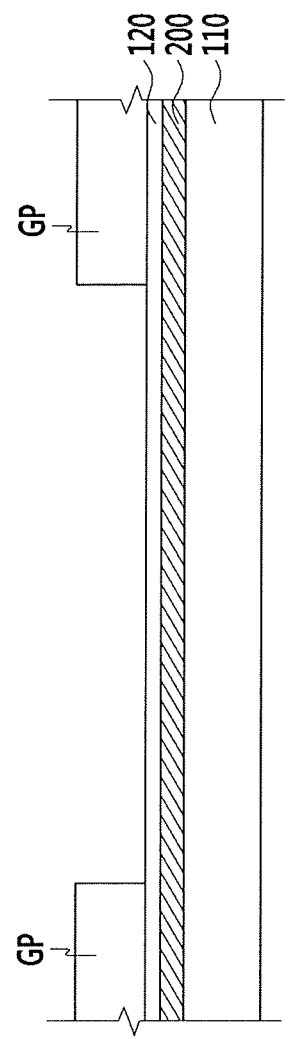
FIG. 1 to FIG. 5 show cross-sectional views of a method for forming a pattern according to an exemplary embodiment of the present invention.

Hereinafter, exemplary embodiments of the present invention will be described in detail with reference to the accompanying drawings. As those skilled in the art would realize, the described embodiments may be modified in various different ways, all without departing from the spirit or scope of the present invention. On the contrary, exemplary embodiments introduced herein are provided to make disclosed contents thorough and complete and sufficiently transfer the spirit of the present invention to those skilled in the art.

In the drawings, the thickness of layers, films, panels, regions, etc., may be exaggerated for clarity. It will be understood that when a layer is referred to as being "on" another layer or substrate, it can be directly on the other layer or substrate, or intervening them may also be present. Like reference numerals designate like elements throughout the specification.

As used herein, the singular forms, "a", "an", and "the" are intended to include plural forms as well, unless the context clearly indicates otherwise.

Block Copolymer

A block copolymer according to an exemplary embodiment of the present invention includes a first block and a second block for copolymerizing the first block, and the second block includes a silyl group including a ring-type functional group.

The first block has a greater etching rate than the second block in dry etching including oxygen.

The ring-type functional group may be, for example, a triphenyl silyl group expressed in Formula 1.

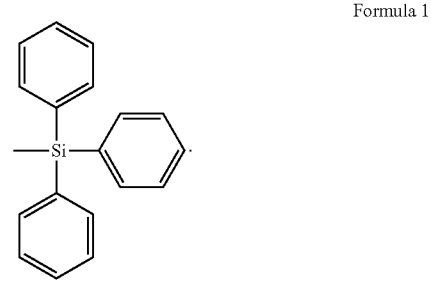 [SMILES: C[Si](c1ccccc1)(c1ccccc1)c1ccccc1]

Formula 1

The triphenyl silyl group is provided as an example, and a bulky ring-type functional group as well as a derivative having a substituted form of hydrogen connected to a benzene ring may be included in a second block according to an exemplary embodiment of the present invention. Further, differing from the expression of Formula 1, rather than always three, one or two ring-type functional groups may be connected.

The first block includes, for example, one that is selected from a group including polymethyl methacrylate, polyethylene oxide, polyvinyl pyrrolidone, polyferrocenylsilane, and polyisoprene.

The second block may include, for example, at least one of polymethyl methacrylate, polyvinyl pyrrolidone, polyisoprene, and polystyrene, and the ring-type functional group may have, for example, a structure connected to at least one of polymethyl methacrylate, polyvinyl pyrrolidone, polyisoprene, and polystyrene.

Without being restricted to the above-described types of the first block and the second block, when the first block is a polymer material with a greater etching rate than the second block, it is applicable in an extended manner.

The first block and the second block may be compounds expressed, for example, in Formula 2.

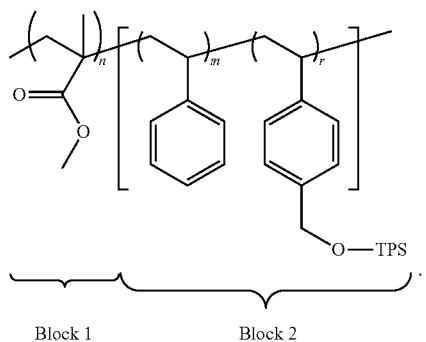

Formula 2

Block 1    Block 2

Here, TPS may be a triphenyl silyl group, n and m may be 0-99, and r may be 1-99.

Regarding the compound expressed in Formula 2, a surface characteristic of the second block including a ring-type functional group may be changed when silicon (Si) is exposed on the surface and is then increased in the case of phase separation. However, the bulky ring-type functional group is provided near the silicon (Si) so exposure of the silicon (Si) to the surface is prevented in the phase separation process.

A Method for Forming a Pattern

FIG. 1 to FIG. 5 show cross-sectional views of a method for forming a pattern according to an exemplary embodiment of the present invention.

Referring to FIG. 1, a mother pattern layer 200, which is a target material on which a pattern will be formed, is formed on a substrate 110. A neutralization layer 120 is formed on the mother pattern layer 200. The substrate 110 includes, for example, a glass substrate, a quartz substrate, or a plastic substrate. The neutralization layer 120 is a layer that has no hydrophilic property or hydrophobic property but indicates neutrality in a chemical manner. The neutralization layer 120 may be formed with, for example, a self-assembled monolayer (SAM), a polymer brush, and a cross-linked random copolymer mat (MAT), or it may be formed with an organic monolayer including the MAT. Alternatively, in an embodiment, the neutralization layer 120 may be omitted.

The surface of the substrate 110 may be preprocessed by, for example, using an acid solution such as hydrofluoric acid (HF) before the mother pattern layer 200 is formed.

A guide pattern (GP) is formed on the neutralization layer 120. The guide pattern (GP) may be formed through, for example, a photolithography process by using a photoresist. For example, a photoresist film is formed on the neutralization layer 120 and the photoresist film is then developed by irradiating light to an upper part of the mask thereby forming the guide pattern (GP) formed with a photoresist material. The guide pattern (GP) is not restricted to the photolithography process and it may be formed by using other methods such as, for example, a nanoimprint process.

The guide pattern (GP) controls directivity of the block copolymer to be formed. A distance between the guide patterns (GP) may be formed to be, for example, less than about 2 μm. However, in an embodiment, the distance between the guide patterns (GP) may be alternatively formed to be greater than 2 μm in consideration of a limit of the resolution of photo-equipment when it is formed by the photolithography process.

Figure 2:
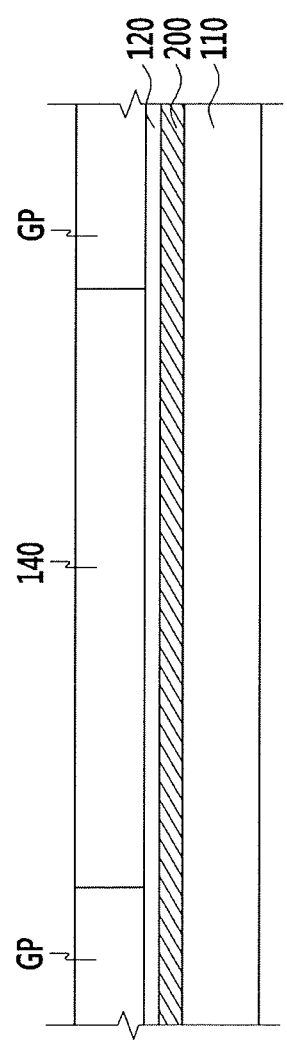

Referring to FIG. 2, the above-described block copolymer is coated between the guide patterns (GP) by using, for example, a spin coating method, to thereby form a polymer thin film 140. The polymer thin film 140 is a polymer generated by a covalent bond of at least two different blocks. The at least two different blocks have different physical and chemical properties. Accordingly, one of the blocks may have a relatively greater etching rate than the other block.

For example, the first block may include one that is selected from a group including polymethyl methacrylate, polyethylene oxide, polyvinyl pyrrolidone, polyferrocenylsilane, and polyisoprene. The second block may be, for example, at least one of polystyrene, polymethyl methacrylate, polyvinyl pyrrolidone, polyisoprene, and polystyrene including a ring-type functional group.

The ring-type functional group may be a triphenyl silyl group expressed, for example, in Formula 1.

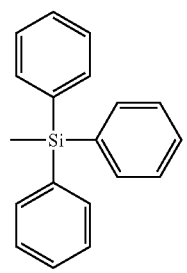

Formula 1

The triphenyl silyl group may be connected to, for example, at least one of polystyrene, polymethyl methacrylate, polyvinyl pyrrolidone, polyisoprene, and polystyrene, and silicon (Si) may be connected to three phenyl groups.

The first block and the second block may be compounds expressed, for example, in Formula 2.

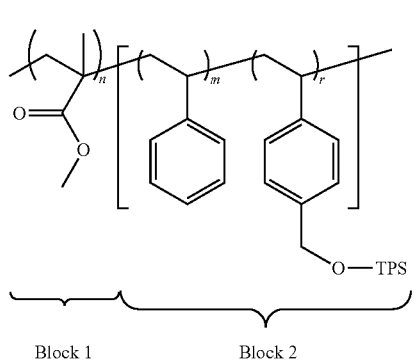

Formula 2

Block 1    Block 2

Here, TPS may be a triphenyl silyl group, n and m may be 0-99, and r may be 1-99.

Methods for forming the polymer thin film 140 including the first block and the second block include various methods such as, for example, nitroxide mediated radical polymerization (NMRP), atom transfer radical polymerization (ATRP), reversible addition-fragmentation chain transfer (RAFT), negative ion polymerization, positive ion polymerization, and ring-opening metathesis polymerization (ROMP). The second block may have a structure in which, for example, a monomer including the triphenyl silyl group is combined with a monomer including no triphenyl silyl group as a concentration of the monomer including the triphenyl silyl group may be controlled in the case of synthesis.

Figure 3:
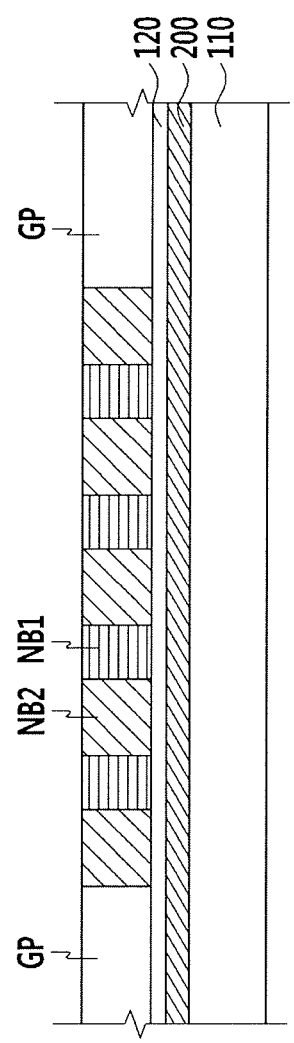

Referring to FIG. 3, the substrate 110 including the polymer thin film 140 is, for example, annealed. The annealing process may be performed as, for example, thermal annealing or solvent annealing. When the annealing process is performed, the polymer thin film 140 is phase-separated into the first block NB1 and the second block NB2. In this instance, as the silicon (Si) is surrounded by the bulky ring-type functional group, exposure of the silicon (Si) to the surface of the second block NB2 may be intercepted.

Figure 4:
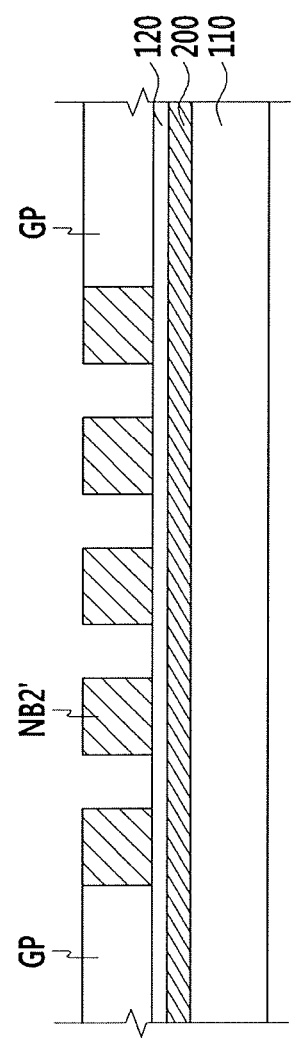

Referring to FIG. 4, the first block NB1 is eliminated. Accordingly, the guide pattern (GP) remains on the neutralization layer 120.

The first block NB1 may be selectively eliminated by, for example, performing dry etching using a gas including oxygen. For example, the ultraviolet rays are irradiated to the first block NB1 and the second block NB2, and the first block NB1 may be selectively removed according to an etching selectivity difference through reactive ion etching (RIE).

In this instance, the second block NB2 is transformed into a transformed second block (NB2') including, for example, a compound including a silicon oxide (SiOx) having etching resistance by oxygen dry etching.

Figure 5:
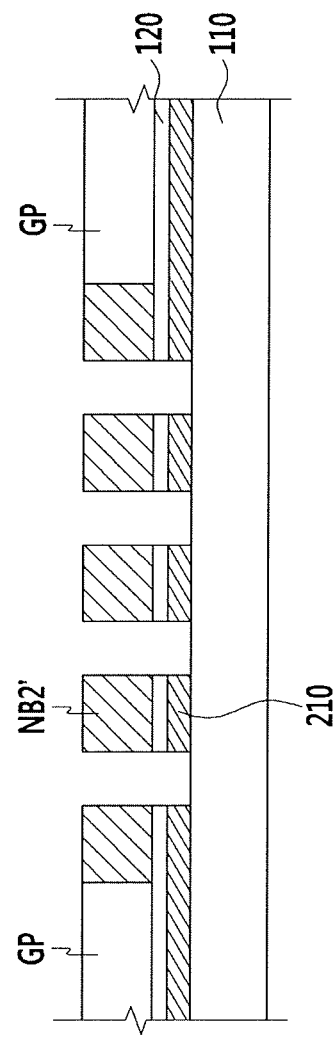

Referring to FIG. 5, a patterned mother pattern layer 210 may be formed by, for example, using the transformed second block (NB2') as a mask and dry-etching the neutralization layer 120 and the mother pattern layer 200. When the mother pattern layer 200 is dry-etched, a gas including at least one of tetrafluoromethane ($CF_4$), sulfur hexafluoride ($SF_6$), and chlorine ($Cl_2$) may be used to dry etch the same.

The guide pattern (GP) may be removed. For example, the substrate 110 including the transformed second block (NB2') and the guide pattern (GP) is dipped into a solution including toluene and a sonication process is performed thereon to remove the guide pattern (GP). In this instance, the transformed second block (NB2') may be removed, and it may remain on the patterned mother pattern layer 210 by controlling an etch condition.

Figure 6:
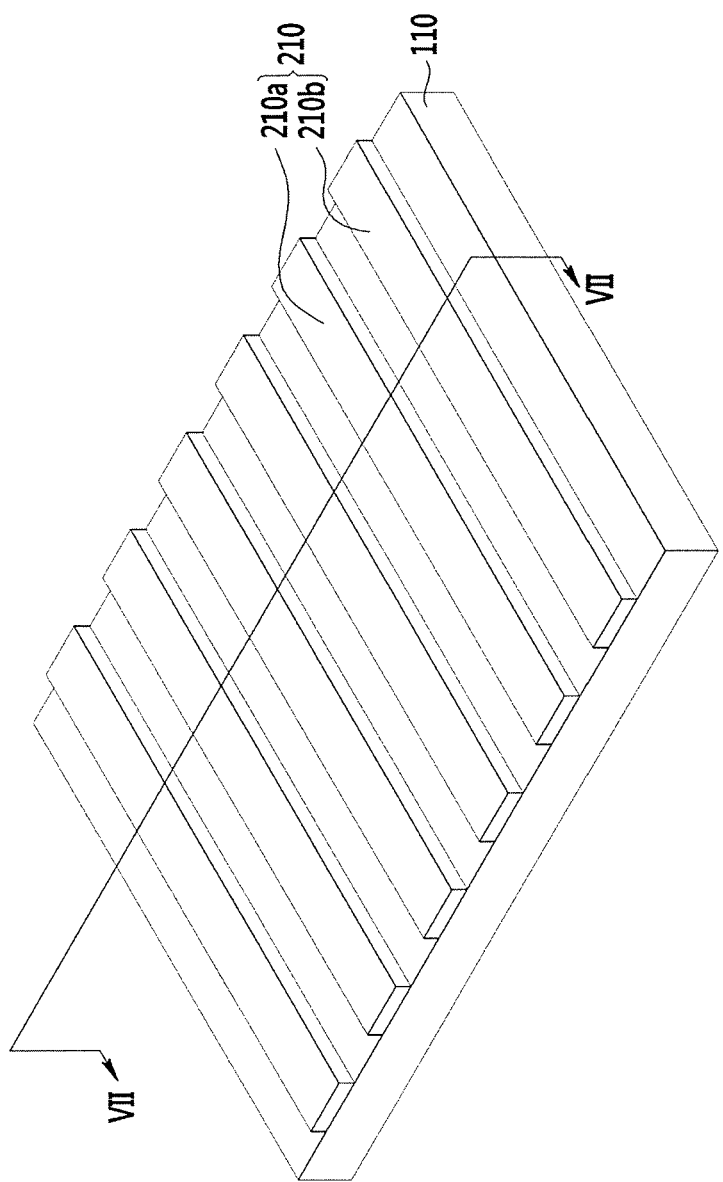
FIG. 6 shows a perspective view of a pattern formed a method for forming a pattern described with reference to FIG. 1 to FIG. 5.
Figure 7:
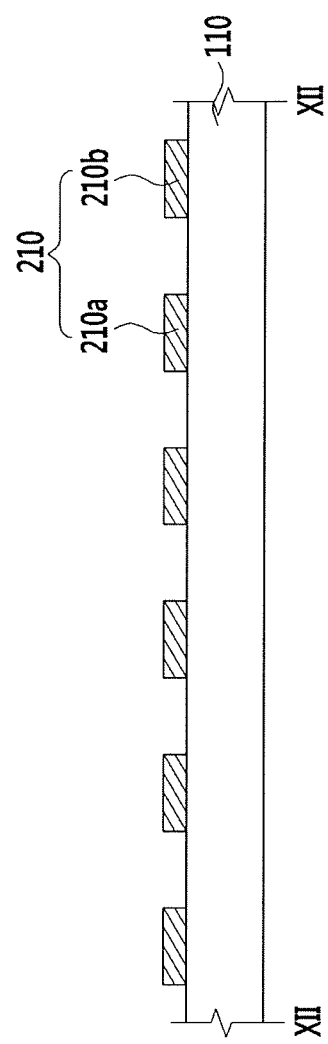
FIG. 7 shows a cross-sectional view with respect to a line VII-VII of FIG. 6.

FIG. 6 shows a perspective view of a pattern formed a method for forming a pattern described with reference to FIG. 1 to FIG. 5. FIG. 7 shows a cross-sectional view with respect to a line VII-VII of FIG. 6.

The pattern shown in FIG. 6 and FIG. 7 may be a metal pattern configuring a polarizer. Referring to FIG. 6 and FIG. 7, a linear lattice pattern 210 including a first line 210a and a second line 210b formed on the substrate 110 is formed by patterning the mother pattern layer 200.

The first and second lines 210a and 210b are extended in, for example, a first direction D1 of the substrate 110. The second line 210b may be disposed in, for example, a second direction D2 that is different from the first direction D1 of the first line 210a. The first and second lines 210a and 210b may include, for example, aluminum, silver, platinum, gold, palladium, tungsten, copper, iron, nickel, zinc, or lead.

The present exemplary embodiment described with reference to FIG. 6 and FIG. 7 represents a method for forming a polarizer, and various nanopattern structures in addition to the polarizer may be formed by using the method for forming a pattern according to an exemplary embodiment of the present invention.

Figure 8:
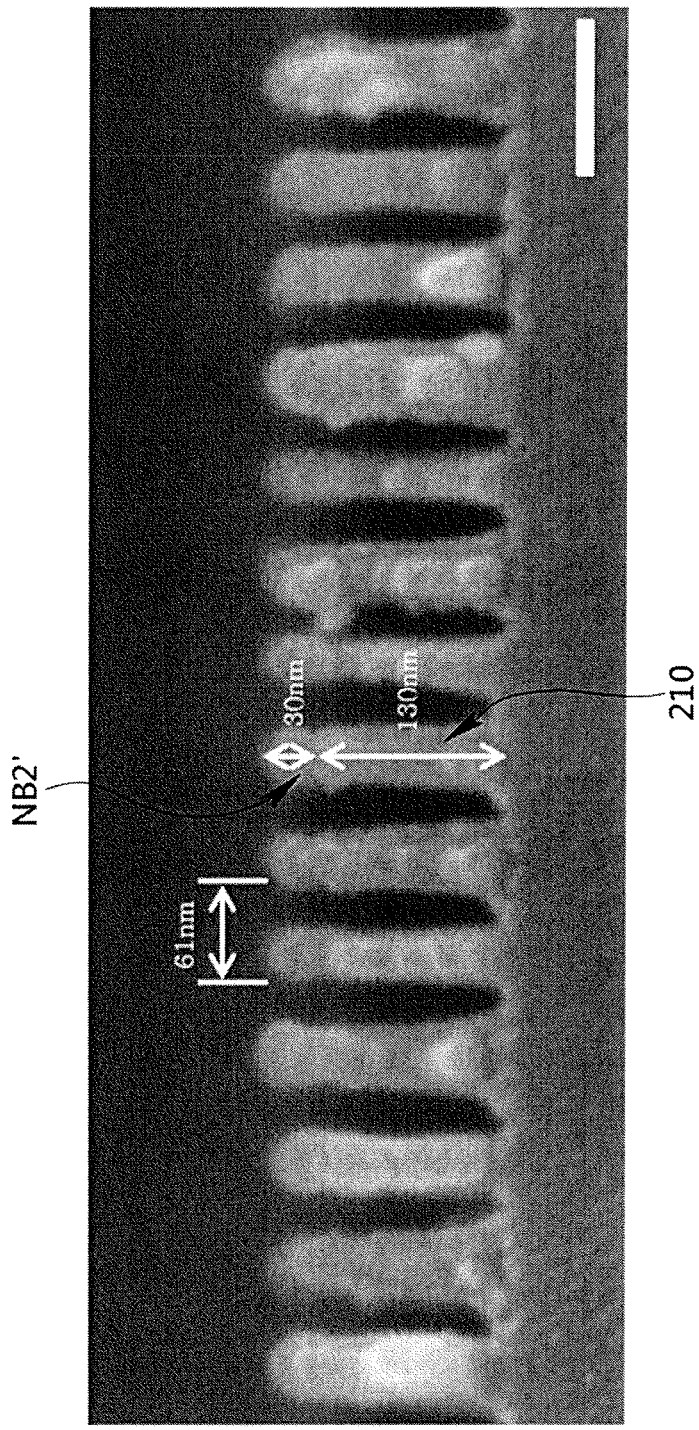
FIG. 8 shows a photograph of a nanostructure manufactured by a method for forming a pattern according to an exemplary embodiment of the present invention.
Figure 9:
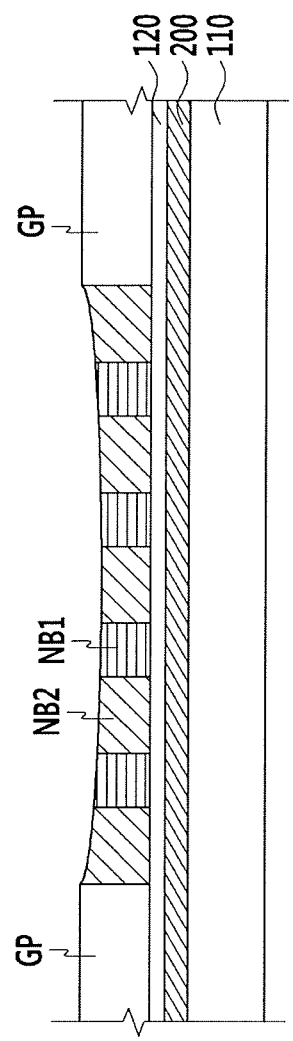
FIG. 9 shows a cross-sectional view for forming a meniscus between guide patterns in a process for forming a pattern according to an exemplary embodiment of the present invention.

FIG. 8 shows a photograph of a nanostructure manufactured by a method for forming a pattern according to an exemplary embodiment of the present invention. FIG. 9 shows a cross-sectional view for forming a meniscus between guide patterns in a process for forming a pattern according to an exemplary embodiment of the present invention.

Referring to FIG. 8, the dry etched state of the mother pattern layer 200 with the second block (NB2') including a silicon oxide (SiOx) as a mask is shown. The second block (NB2') includes, for example, a silicon oxide (SiOx) having great etching resistance so it is possible to form a greater aspect ratio than the organic material mask. Further, the mother pattern layer 200 may be etched in a uniform manner when a meniscus is formed between the guide patterns GP as shown in FIG. 9.

Having described exemplary embodiments of the present invention, it is further noted that it is readily apparent to those of ordinary skill in the art that various modifications may be made without departing from the spirit and scope of the invention which is defined by the metes and bounds of the appended claims.

What is claimed is:

1. A block copolymer comprising:

a first block; and a second block copolymerized with the first block, wherein the second block includes a silyl group including a ring-type functional group, wherein the first block and the second block are compounds expressed in Formula 2:

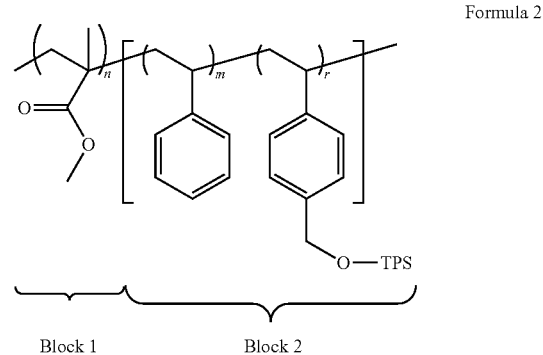

(wherein TPS is a triphenyl silyl group, n and m are 0-99, and r is 1-99).

2. The block copolymer of claim 1, wherein the ring-type functional group is a triphenyl silyl group expressed in Formula 1:

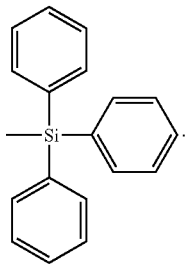

Formula 1

3. The block copolymer of claim 2, wherein the second block includes at least one selected from the group including polymethyl methacrylate, polyvinyl pyrrolidone, polyisoprene, and polystyrene, and wherein the ring-type functional group is connected to at least one selected from the group consisting of the polymethyl methacrylate, the polyvinyl pyrrolidone, the polyisoprene, and the polystyrene.

4. The block copolymer of claim 3, wherein the first block includes one selected from a group including polymethyl methacrylate, polyethylene oxide, polyvinyl pyrrolidone, and polyisoprene.

5. A method for forming a pattern, comprising:
coating the block copolymer of claim 1 on a substrate on which a mother pattern layer is formed, to thereby form a polymer thin film;
selectively removing the first block from the polymer thin film; and
etching the mother pattern layer and a neutralization layer on the mother pattern layer using the second block as a mask to expose the substrate.

6. The method of claim 5, further comprising:
thermally annealing or solvent-annealing the polymer thin film.

7. The method of claim 6, further comprising:
forming a guide pattern before forming the polymer thin film,
wherein the polymer thin film is formed between the guide patterns.

8. The method of claim 7, wherein the guide pattern is formed with a photoresist.

9. The method of claim 5, further comprising annealing the substrate including the polymer thin film to thereby phase-separate the polymer thin film into the first block and the second block.

10. The method of claim 9, wherein the neutralization layer is formed with a self-assembled monolayer (SAM), a polymer brush, and a cross-linked random copolymer mat (MAT).

11. The method of claim 9, wherein a distance between guide patterns is less than about 2 um.

12. The method of claim 5, wherein the selectively removing of the first block includes performing dry etching with a gas including oxygen ($O_2$).

13. The method of claim 12, wherein the etching of the mother pattern layer includes performing dry etching with a gas including at least one of tetrafluoromethane ($CF_4$), sulfur hexafluoride ($SF_6$), and chlorine ($Cl_2$).

14. The method of claim 12, wherein in the selectively removing of the first block, the second block is transformed into a compound including a silicon oxide (SiOx).

15. The method of claim 14, wherein the ring-type functional group is a triphenyl silyl group expressed in Formula 1:

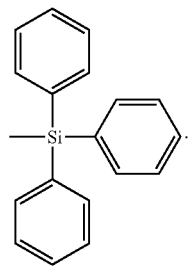

Formula 1

16. The method of claim 15, wherein the second block includes at least one selected from the group including polymethyl methacrylate, polyvinyl pyrrolidone, polyisoprene, and polystyrene, and wherein the ring-type functional group is connected to at least one selected from the group including the polymethyl methacrylate, the polyvinyl pyrrolidone, the polyisoprene, and the polystyrene.

17. The method of claim 16, wherein the first block and the second block are compounds expressed in Formula 2:

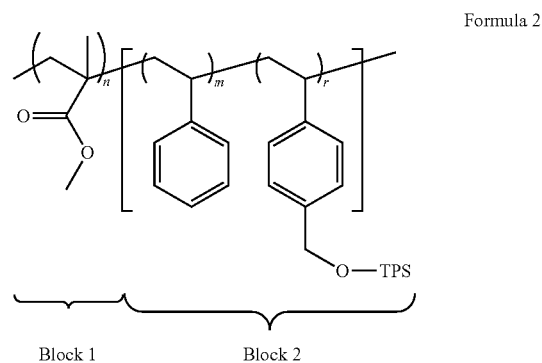

Formula 2

(wherein TPS is a triphenyl silyl group, n and m are 0-99, and r is 1-99).

18. The method of claim 16, wherein the first block includes one selected from a group including polymethyl methacrylate, polyethylene oxide, polyvinyl pyrrolidone, and polyisoprene.

* * * * *